(12) United States Patent
Kohl et al.

(10) Patent No.: US 7,798,817 B2
(45) Date of Patent: Sep. 21, 2010

(54) INTEGRATED CIRCUIT INTERCONNECTS WITH COAXIAL CONDUCTORS

(75) Inventors: Paul A. Kohl, Atlanta, GA (US); Ate He, Atlanta, GA (US); Mark Cupta, Atlanta, GA (US); Muhannad Bakir, Atlanta, GA (US); Todd Spencer, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 11/557,073

(22) Filed: Nov. 6, 2006

(65) Prior Publication Data
US 2007/0105429 A1 May 10, 2007

Related U.S. Application Data

(60) Provisional application No. 60/733,818, filed on Nov. 4, 2005.

(51) Int. Cl.
H01R 12/00 (2006.01)
(52) U.S. Cl. ...................................................... 439/66
(58) Field of Classification Search ................ 439/65, 439/66; 438/106, 618, 622, 667
See application file for complete search history.

(56) References Cited

U.S. PATENT DOCUMENTS

| | | | | |
|---|---|---|---|---|
| 2,446,829 | A | * | 8/1948 | Hergenrother ............... 332/106 |
| 2,557,961 | A | * | 6/1951 | Goldstein et al. ............ 332/144 |
| 4,307,926 | A | * | 12/1981 | Smith ...................... 439/607.52 |
| 4,956,749 | A | | 9/1990 | Chang |
| 5,676,565 | A | * | 10/1997 | Vagnoni ...................... 439/580 |
| 5,759,069 | A | * | 6/1998 | Kitatani et al. .............. 439/675 |
| 6,060,383 | A | * | 5/2000 | Nogami et al. .............. 438/622 |
| 6,224,394 | B1 | * | 5/2001 | Matsumoto .................. 439/66 |
| 6,281,587 | B1 | | 8/2001 | Nogami et al. |
| 6,313,531 | B1 | | 11/2001 | Geusic et al. |
| 6,428,325 | B1 | * | 8/2002 | Kurosawa et al. ............. 439/21 |
| 6,695,644 | B2 | * | 2/2004 | Zhao et al. .................. 439/580 |
| 6,796,811 | B1 | * | 9/2004 | Pupkiewicz et al. ........... 439/86 |
| 6,869,290 | B2 | * | 3/2005 | Brown et al. ................. 439/66 |

(Continued)

OTHER PUBLICATIONS

Chi-Te Chen, et al., A Simulation Study of Simultaneous Switching Noise, Institute of Electrical and Electronics Engineers, 2001.

(Continued)

Primary Examiner—Chandrika Prasad
(74) Attorney, Agent, or Firm—Troutman Sanders LLP; James Hunt Yancey, Jr.; Ryan A. Schneider

(57) ABSTRACT

High performance interconnect devices, structures, and fabrication methods are provided herein. According to some embodiments of the present invention, an interconnect device used to connect components or route signals in an integrated circuit can comprise multiple conductors. A first conductor of the interconnect device can define a first conductor axis, and a second conductor of the interconnect device can define a second conductor axis. The second conductor can be proximate the first conduct such that first conductor axis is substantially coaxially situated relative to the second conductor axis to provide a high performance interconnect having a coaxial alignment. The first conductor and the second conductor can define a gap disposed between and separating the conductors. Other embodiments are also claimed and described.

15 Claims, 9 Drawing Sheets

U.S. PATENT DOCUMENTS

| | | | |
|---|---|---|---|
| 6,932,614 B1 * | 8/2005 | Kan | 439/580 |
| 6,994,564 B1 * | 2/2006 | Kan | 439/63 |
| 7,204,720 B1 * | 4/2007 | Shiu | 439/668 |
| 7,256,752 B2 * | 8/2007 | Wither et al. | 343/905 |
| 2001/0027008 A1 | 10/2001 | Matsumoto | |
| 2001/0033509 A1 | 10/2001 | Ahn et al. | |
| 2002/0139579 A1 | 10/2002 | Kwark | |
| 2002/0142626 A1 | 10/2002 | Smeltz, Jr. | |
| 2003/0207566 A1 | 11/2003 | Forbes et al. | |
| 2005/0191786 A1 | 9/2005 | Cohen et al. | |

OTHER PUBLICATIONS

Kaveh Shakerl, et al., Coaxial Polymer Pillars: Ultra-Low Inductance Compliant Wafer-Level Electrical Input/Output Interconnects For Power Distribution, Institute of Electrical and Electronics Engineers, 2004, 78-81.

Kaveh Shakeri, et al., Compact Physical IR-Drop Models For Chip/Package Co-Design of Gigascale Integration (GSI), IEEE Transcations On Electron Devices, 1087-1096, vol. 52, No. 6, Jun. 2005.

George A. Katopis, Delta-I Noise Specification For A High-Performance Computing Machine, Proceedings Of The IEEE, 1405-1415, vol. 73, No. 9, Sep. 1985.

Ate He, et al., Fabrication of Compliant, Copper-Based Chip-to-Substrate Connections, Institute of Electrical and Electronics Engineers, 2006, 29-34.

Technical Memorandum, Loss Calculations For Rectangular Coaxial Lines, IEEE Proceedings, 207-209, vol. 135, Pt.H, No. 3, Jun. 1988.

Muhannad S. Bakir, et al. Sea of Polymer Pillars Electrical and Optical Chip I/O Interconnections for Gigascale Integration, IEEE Transactions on Electron Devices, 1069-1077, vol. 51, No. 7, Jul. 2004.

* cited by examiner

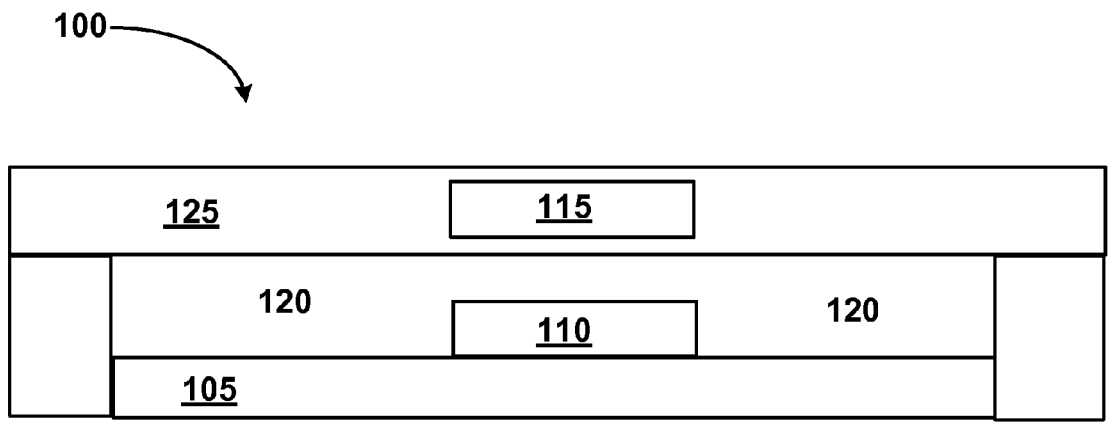
FIG. 1
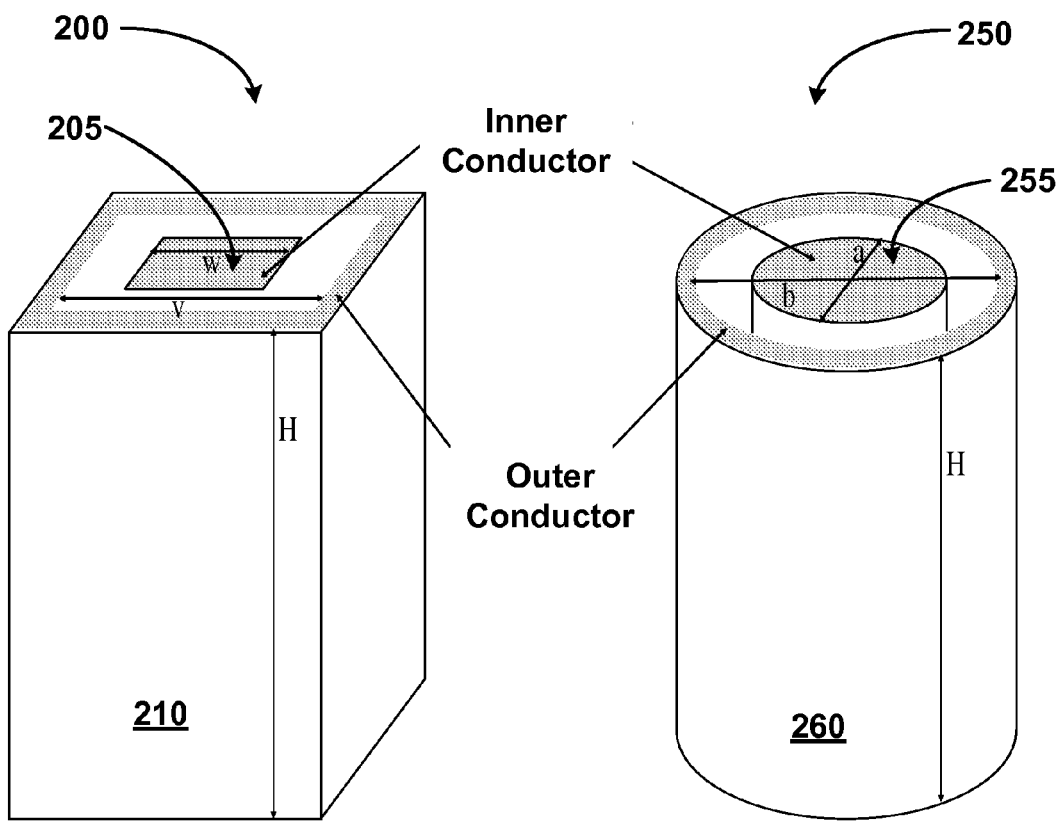
FIG. 2A        FIG. 2B
FIG. 2

INTEGRATED CIRCUIT INTERCONNECTS WITH COAXIAL CONDUCTORS

CROSS-REFERENCE TO RELATED APPLICATION

The present application claims priority to and the benefit of U.S. Provisional Patent Application No. 60/733,818, filed 4 Nov. 2005, and entitled "High Performance Interconnect For Boards, Chips, and Chip-to Board Connections", which is hereby incorporated by reference in its entirety as if fully set forth below.

TECHNICAL FIELD

The various embodiments of the present invention relate generally to integrated circuit interconnect devices, and more particularly, to high performance interconnect devices and structures that can be integrated circuit transmission lines or connect components, and fabrication methods for making such devices and structures.

BACKGROUND

The demands for ever-increasing bandwidths in digital data communication equipment at reduced power consumption lever equipment are constantly growing. These demands not only require more efficient integrated circuit components, but also higher performance interconnect structures and devices and chip-to-substrate connections. Indeed, as one example, the International Technology Roadmap for Semiconductors (ITRS) projects that high performance chips in the very near future will have operating frequencies, both on-chip and off-chip (i.e., chip to substrate), rising above 50 GHz.

This dramatic increase in operating frequencies will require improvements over conventional integrated circuit interconnect structures and fabrication methods. As an example, current interconnect devices are not capable of enabling such high operating frequencies, thus high performance interconnect devices and structures will be needed to support high operational frequencies. In addition, cost-effective fabrication methods to produce high performance interconnect devices and structures will also be needed to provide high performance integrated circuit chips and packages. Some of the challenges in achieving high-bandwidth communication using electrical interconnects include high losses in the substrate dielectric, reflections and impedance discontinuities, and susceptibility to cross-talk.

Accordingly, there is a need for high performance interconnect device, structures, and associated fabrication methods that provide simple fabrication methods to produce interconnects having improved properties with fewer process steps and reduced costs. In addition, there is a need for improved on-chip and off-chip interconnect devices and associated fabrication methods to enable and support increased data throughput. It is to the provision of such interconnects and fabrication methods that the various embodiments of the present invention are directed.

BRIEF SUMMARY

Various embodiments of the present invention are directed to high performance interconnect devices and structures. Some embodiments are also directed to methods to fabricated high performance interconnect devices and structures. When discussing the various embodiments of the present invention herein, reference is sometimes made to interconnects, interconnect structures, interconnect devices, and transmission lines; and at times these terms are used interchangeably.

Also as discussed in more detail below certain embodiments of the present invention can be implemented as on-chip interconnects (or transmission lines) and other embodiments can be implemented as off-chip interconnects. As used herein, on-chip interconnects can be used to connect certain points or areas on a chip and off-chip interconnects can be used to connect multiple components such as an integrated chip and associated substrate. Also, embodiments of the present invention can serve as high performance interfaces between components. The various embodiments of the present invention can be fabricated using certain build up process as well as imprinting techniques.

Broadly described, an interconnection device according an embodiment of the present invention can comprise a first conductor and a second conductor. The second conductor can be disposed proximate the first conductor and also be substantially coaxially situated to the second conductor. The first conductor and the second conductor can define a gap between each other. The gap can comprise a gas so that the gas clads the first conductor. The gap can have a thickness ranging from approximately 10 micrometers to approximately 1 millimeter. Also, a polymer material and/or air can be disposed in the gap. The first conductor and the second conductor can have an aspect ratio ranging from approximately 0.1 to 100. The first conductor can be suspended on a surface extending from the second conductor and also be disposed in a gap between the conductors. The first and second conductor can comprise multiple portions, and they can have a height ranging from approximately ten micrometers to approximately 500 micrometers.

The first and the second conductor can also have certain other characteristics in accordance with embodiments of the present invention. For example, the first conductor can be a hot conductor and the second conductor can a ground conductor to form a waveguide. The waveguide can transmit a data signal, such as a radio frequency signal. The first conductor can having a diameter and the second conductor can having an inner diameter. The ratio of the inner diameter to the diameter can range from approximately one to approximately one and a half. The first conductor and the second conductor can have a polygonal or circular cross section area. The first conductor and the second conductor can be with at least one of copper, gold, silver, nickel, or an alloy. The first conductor and the second conductor have a sidewall surface that is one of a substantially vertical alignment, a substantially horizontal alignment, a sloped alignment, or normal to a substrate surface.

An interconnect fabrication method embodiment according to the present invention can comprise providing a first conductor, providing a second conductor, and disposing the second conductor proximate at least a portion of the first conductor so that first conductor and the second conductor are electrically separated by a gap. The gap can be disposed between the first conductor and the second conductor. A fabrication method can also include aligning the first conductor axis and the second conductor axis in a substantially coaxial alignment such that interconnect is a coaxial interconnect. Still yet, a fabrication method can include providing a gas in the gap such that the gas is located between the first conductor and the second conductor and the gas clads the first conductor. The gas can be air such that the gap consists essentially of air.

Other features of a fabrication method embodiment can include forming at least one of the first conductor and the second conductor to have at least one of a polygonal or circular cross sectional shape. In addition, a method can comprise providing at least a portion of one of the first conductor or the second conductor by electroplating at least one of a metal or a metal alloy. Still yet, a method can include forming at least one of the first conductor and the second conductor with multiple portions to provide the first conductor or the second conductor is a composite. The first conductor can be coupled to a hot plane that couples the first conductor to at least one other hot conductor of another interconnect structure, and the second conductor can be coupled to a ground plane so that the second conductor is coupled to at least one other ground conductor of another interconnect. A material can be imprinted, such as by nanoimprinting, to provide a pattern used to form at least one of the first conductor and the second conductor. Also, the first and second conductor can be comprised of isolated detached portions.

In yet another embodiment of the present invention, an integrated system comprising interconnects with multiple conductors, an interconnect structure can comprise a first conductor proximate a substrate. A second conductor can be placed proximate the first conductor such that the second conductor is separated from the first conductor by a gap region disposed between the first conductor and the second conductor. The second conductor can be disposed at least partially above or below the first conductor. The gap region can comprise at least one air gap layered on a second air gap. The first conductor can have an exterior sidewall surface and the second conductor can have an interior sidewall surface. The exterior sidewall surface can be substantially parallel to the interior sidewall surface.

Other embodiments of the present invention can comprise a third conductor. The third conductor can be disposed below the first conductor, and situated proximate the second conductor so that the second and third conductors at least partially surround the first conductor. The first conductor can be suspended on a polymer layer above the substrate and the second conductor is generally disposed around the first conductor. Alternatively, a third conductor can be disposed between the first and second conductors and the first and second conductors can substantially encase the third conductor. The first conductor and the second conductor can be coaxially aligned. Also, the first conductor and the second conductor can have corresponding angular turns such that the first and second conductors form a transmission line to carry a signal from a first component to a second component.

Other aspects and features of embodiments of the present invention will become apparent to those of ordinary skill in the art, upon reviewing the following description of specific, exemplary embodiments of the present invention in conjunction with the accompanying figures.

BRIEF DESCRIPTION OF DRAWINGS

FIG. 1 illustrates a cross-sectional view of a micro-strip interconnect structure in accordance with some embodiments of the present invention.

FIG. 2 illustrates a perspective view of two coaxial interconnect structures according to some embodiments of the present invention with FIG. 2A depicting a square coaxial interconnect structure and FIG. 2B depicting a circular coaxial interconnect structure.

DETAILED DESCRIPTION OF PREFERRED & ALTERNATIVE EMBODIMENTS

Figure 3:
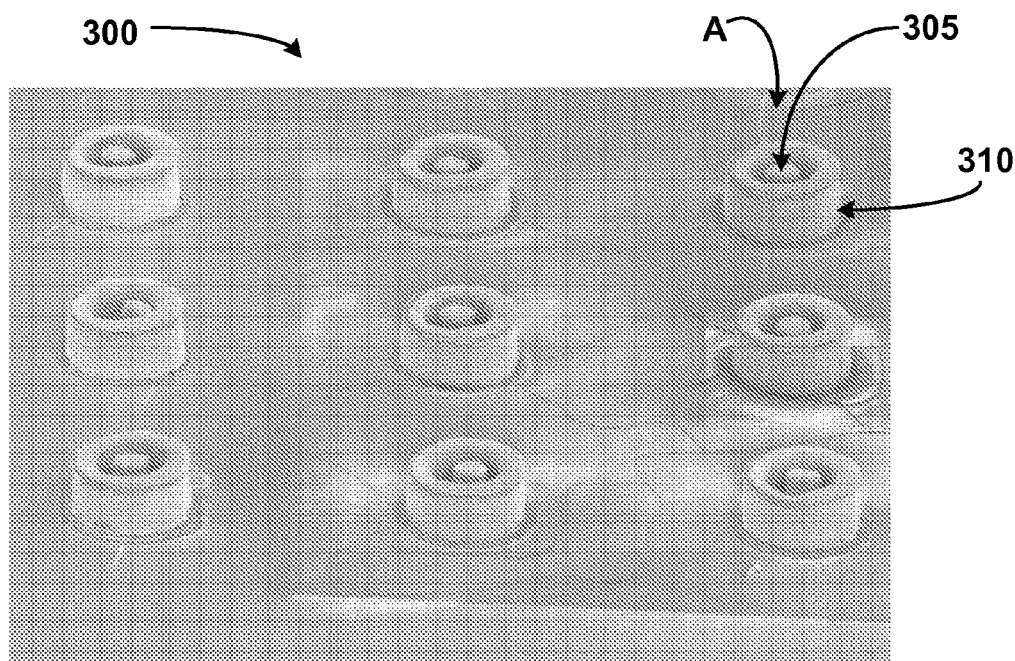
FIG. 3 illustrates a perspective view of an array of coaxial interconnect structures fabricated in accordance with some embodiments of the present invention.

Referring now to the figures, wherein like reference numerals represent like parts throughout the several views, exemplary embodiments of the present invention will be described in detail. Throughout this description, various components may be identified having specific values or parameters, however, these items are provided as exemplary embodiments. Indeed, the exemplary embodiments do not limit the various aspects and concepts of the present invention as many comparable parameters, sizes, ranges, and/or values may be implemented.

The various embodiments of the present invention provide high performance interconnect structures and associated interconnect fabrication methods. Interconnects according to the present invention can be on-chip or off-chip interconnect structures. In addition, interconnects fabricated in accordance with embodiments of the present invention can low loss characteristics and can also be compact interconnects to enable small integrated package sizes. Interconnects fabricated in accordance with embodiments of the present invention can be utilized to route radio frequency (RF) signals such that the frequency of the RF signals need not be adjusted for transmission. Still yet, some interconnect embodiments of the present invention have low inductance values to provide an interconnect having low power loss, efficient signal carrying characteristics, and low simultaneous switching noise characteristics.

Some interconnect structures according to the present invention can be fabricated as coaxially-shaped interconnects with an inner conductor and an outer conductor disposed proximate the inner conductor. The two conductors (inner and outer) can be separated by a gap thereby providing ultra-low loss and ultra low permittivity characteristics. Matter can be disposed within the gap such as a gas, solid, or a combination thereof. Alternatively, air can be disposed within the gap to provide an air cladding around an inner conductor.

FIG. 1 illustrates a cross-sectional view of a micro-strip interconnect 100 comprising multiple conductive layers in accordance with some embodiments of the present invention. As shown, the interconnect 100 generally comprises a substrate 105, a first conductor 110, and a second conductor 115. The first conductor 110 is shown disposed on the substrate 105, and the second conductor 115 is shown disposed within a material, such as a polymer material. The second conductor 115 can be suspended in a material or at least partially disposed with a material. The conductors 105, 110 can be used to connect electrical components and/or carry data signals, such as RF signals. As an example, the interconnect 100 may be used as a transmission line to connect electrical components on the same integrated chip, the same board, or to connect one chip to another chip. The substrate 105 can comprise organic materials such that the substrate 105 is organic. Other substrate materials can include low cost fiberglass/epoxy substrates based on the resins of tetra-bromo bisphenol A (FR4) and bismalemide triazine (BT).

As shown, the interconnect 100 is fabricated in a parallel plate arrangement. The two conductors 110, 115 are electrically isolated from each other with the first conductor 110 being disposed below the second conductor 115. The two conductors 110, 115 may have different widths, thickness, or made of different metals. Alternatively, the physical characteristics of the two conductors 110, 115 may be substantially the same. An advantageous feature of some embodiments of the present invention is the use an air gap or air cladding to separate, at least partially, conductors. Air gap 120 is illustrated in FIG. 1 as isolating the first conductor 110 and the second conductor 115 from each other. Indeed, the air gap 120 separates the first conductor 110 from the second conductor 115.

While the conductors 110, 115 of interconnect 100 are fabricated in plates parallel to one another, other transmission line arrangements are also contemplated and possible in accordance with the various embodiments of the present invention. For example, such additional arrangements may include microstrip, co-planar strip line, strip line, rectangular, and coaxial alignment. In addition, the interconnect 100 can be utilized as a horizontal or vertical interconnect structure, or can be fabricated to connect such interconnect structures. Still yet, the interconnect 100 can be fabricated in straight line arrangements, square shaped structures, or to connect interconnects at different vertical levels on multi-layered chips.

FIG. 2 illustrates a perspective view of two coaxial interconnect structures according to some embodiments of the present invention. More specifically, FIG. 2A depicts a square coaxial interconnect structure 200 and FIG. 2B depicts a circular coaxial interconnect structure 250. As illustrated in FIGS. 2A and 2B, an interconnect device according to the present invention can comprise a first conductor 205, 255 and a second conductor 210, 260. The first conductor 205, 255 may be an inner conductor and the second conductor 210, 260 may be an outer conductor or shell conductor in a coaxial interconnect device. The first conductor 205, 250 can define a first conductor axis, and the second conductor 210, 260 can define a second conductive axis. As illustrated in FIGS. 2A and 2B, the second conductor 210, 260 is disposed around the first conductor 205, 255 such that first conductor axis is substantially coaxially aligned with the second conductor axis.

The interconnects 200, 255 can be fabricated of copper and can be used as chip-to-substrate power and ground connections (or Inputs/Outputs). For example, the first conductors 205, 255 and the second conductors 210, 260 in a coaxial configuration can be connected to a power plane and a ground plane, respectively. That is the first conductors 205, 255 can be coupled together and the second conductors 210, 260 can be coupled together. The ratio between an inner diameter of the second conductors 210, 260 and the outer diameter of the inner conductors 205, 255 can range from approximately one to approximately one and a half. This advantageous feature of embodiments of the present invention enables low parasitic loop inductance relative to conventional technologies.

As shown by interconnects 200, 250 embodiments of the present invention enable production of circular and non-circular shaped interconnect structures. A square coaxial structure may have a lower parasitic inductance over a circular coaxial structure if the width of the center square equals the diameter of the center pillar in the circular structure with the same gap between the center and the shell.

Variation of the ratio of the physical characteristics of the interconnects 200, 255 can alter associated inductances. For example, if the ratio between inner conductor thickness to interior width of an outer conductor becomes smaller, a coaxial interconnect can provide an improved and low parasitic inductance. In addition, a square coaxial structure may have a lower parasitic inductance over a circular coaxial structure if the width of an inner square conductor equals the diameter of a center circle conductor in a circular coaxial structure with the same gap distance between the conductors.

FIG. 3 illustrates a perspective view of an array 300 of coaxial interconnect structures fabricated in accordance with some embodiments of the present invention. While certain portions of the discussion herein discuss a particular interconnect, it should be understood that embodiments of the present invention can be utilized to form an interconnect array, such as array 300. The interconnects discussed herein according to the various embodiments of the present invention can be formed as discussed in greater detail below, and also in accordance with the fabrication methods discussed in U.S. patent application Ser. No. 11/534,668, which is hereby incorporated by reference in its entirety as if fully set forth herein. In addition, the interconnects discussed herein can have physical characteristics similar to the interconnects discussed in this application.

As shown, array 300 consist of multiple interconnects, such as interconnect A. Each of the illustrated interconnects in FIG. 3 have coaxially aligned conductors. Indeed, as shown, each interconnect has a center (or inner) conductor and a shell (or outer) conductor disposed around the center conductor. For example, interconnect A has an inner conductor 305 and an outer conductor 310. In accordance with some embodiments of the present invention, the center and shell conductors are substantially coaxially aligned. Indeed, inner conductor 305 and outer conductor 310 are substantially coaxially aligned. In other embodiments, the conductors may not be coaxially aligned.

In an array configuration, all of the center conductors of the interconnects may be coupled together and all of the outer conductors of the interconnects may be coupled together.

This coupling can be accomplished with materials beneath the surface upon which the interconnects are disposed upon. For example, one sub surface conductive layer may connect the inner conductors and another sub surface may connect the outer conductors. Other coupling methods in interconnect arrays are also possible in accordance with embodiments of the present invention. Such coupling can enable the interconnects to be utilized as I/O interconnects.

Also as illustrated, the interconnects in array 300 have gap regions defined between the inner and outer conductors. More specifically, with reference to interconnect A, a gap region can be defined between an outer surface wall of the center conductor 305 and the interior surface wall of the shell conductor 310. The gap region can be formed to hold or contain a gas, such as ambient air, or a material can be placed within the gap. For example, a dielectric material or a polymer material may be disposed within the gap region. Based on the application and use of the interconnect array 300, it may be desirable to leave the gap empty such that ambient air is in the gap or another material or gas is disposed within the gap. In other embodiments a combination of substances may be disposed within the gap region.

The interconnect array 300 can be used to connect (or couple) multiple components. The components can be different devices and alternatively can be different components within an IC packaged device. For example, the interconnect array 300 can be used as interconnect input/output that provide signals and power to a chip. In addition, the interconnects can be used as wave guides to transmit data signals, such as RF signals, from one component to another. Components can include integrated circuits, semiconductor wafers, substrates, or any other items to be electrically connected or coupled. Typically, interconnects connect components by having ends attached, bonded, or coupled to a surface of a component.

As illustrated, the array 300 comprises interconnects all having similar physical characteristics. Such characteristics include height, thickness, interior and exterior diameters, composition, and cross-section geometry. In some embodiments, it may be desirable to vary these characteristics. For example, the center conductors may have a circular cross section and the outer conductor may have a square shaped cross section. Advantages of different geometrical cross sections include the ability to tune a characteristic impedance and design of an interconnect structure for minimized losses or uniform electromagnetic fields. Other varying physical characteristics are also achievable in accordance with other embodiments of the present invention.

Figure 4:
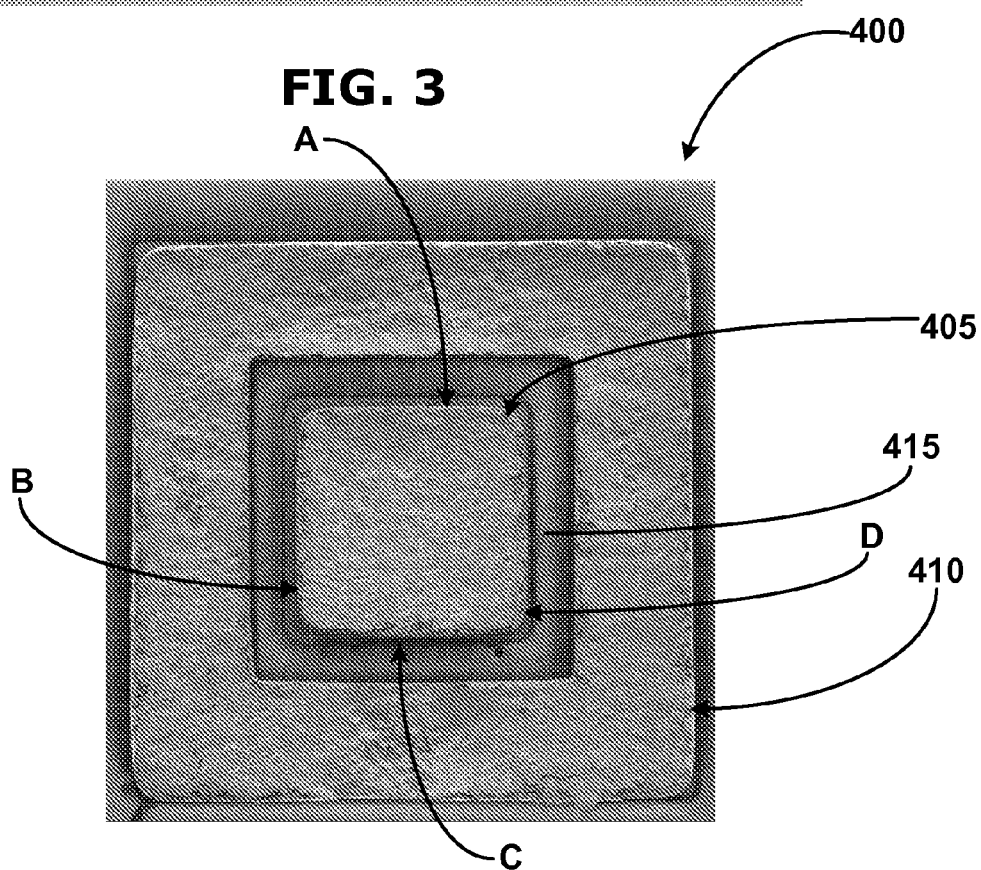
FIG. 4 illustrates a top view of a rectangular coaxial interconnect structure fabricated in accordance with some embodiments of the present invention.

FIG. 4 illustrates a top view of a coaxial interconnect structure 400 fabricated in accordance with some embodiments of the present invention. As shown, this interconnect structure 400 is formed with an inner conductor 405 and an outer conductor 410. The inner conductor 405 is separated from the outer conductor 410 by a gap 415. Indeed, the gap 415 can encase or surround the inner conductor 405 such that it is electrically separated from the outer conductor 410. Such separation enables the two conductors 405, 410 to carry an electrical signal. Also as shown, the inner conductor 405 can be substantially coaxially aligned with the outer conductor 410.

The inner conductor 405 may be positioned within the outer conductor 410 in various positions in accordance with the embodiments of the present invention. As shown, the inner conductor 405 is separated from the outer conductor 410 at approximately equal distances on each of its exterior sidewall surfaces A, B, C, and D. This type of separation may be desirable in some embodiments and in other embodiments, the separation distances may vary.

Also, the inner conductor 405 can be positioned within the outer conductor 410 so that the conductors have corresponding sidewalls. For example, as shown, the inner conductor 405 has exterior sidewalls and sidewall surfaces A, B, C, and D. The sidewall surfaces A, B, C, and D can be substantially parallel to the interior sidewalls of the outer conductor 410. The corresponding sidewalls can be substantially normal to a component on which the interconnect 400 is coupled, or the corresponding sidewalls can also be sloped or angled as shown in FIGS. 5 and 6.

Figure 5:
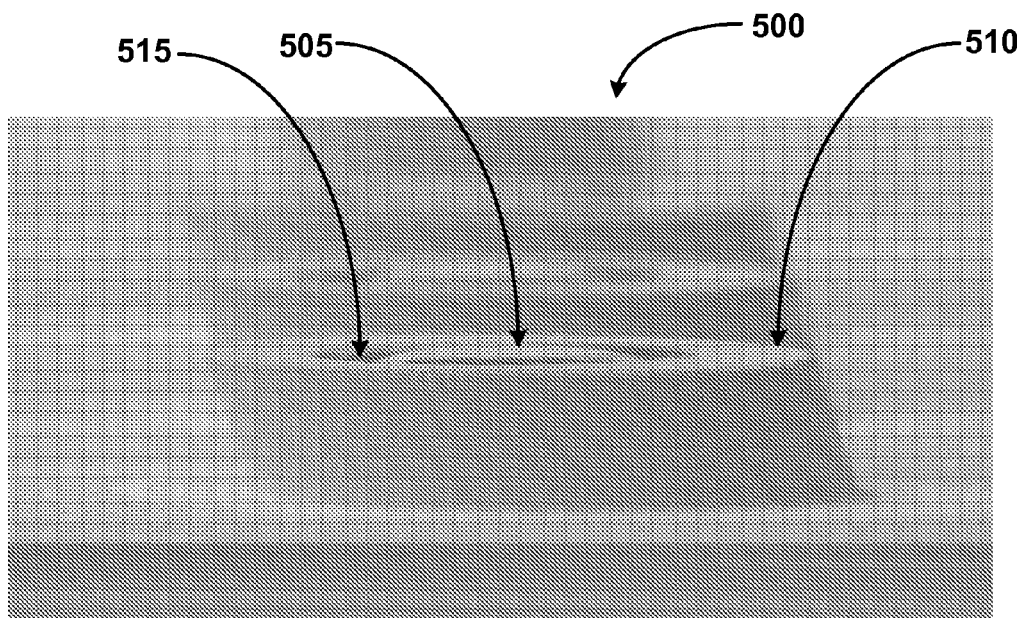
FIG. 5 illustrates a side view of a sloped coaxial interconnect structure fabricated in accordance with some embodiments of the present invention.
Figure 6:
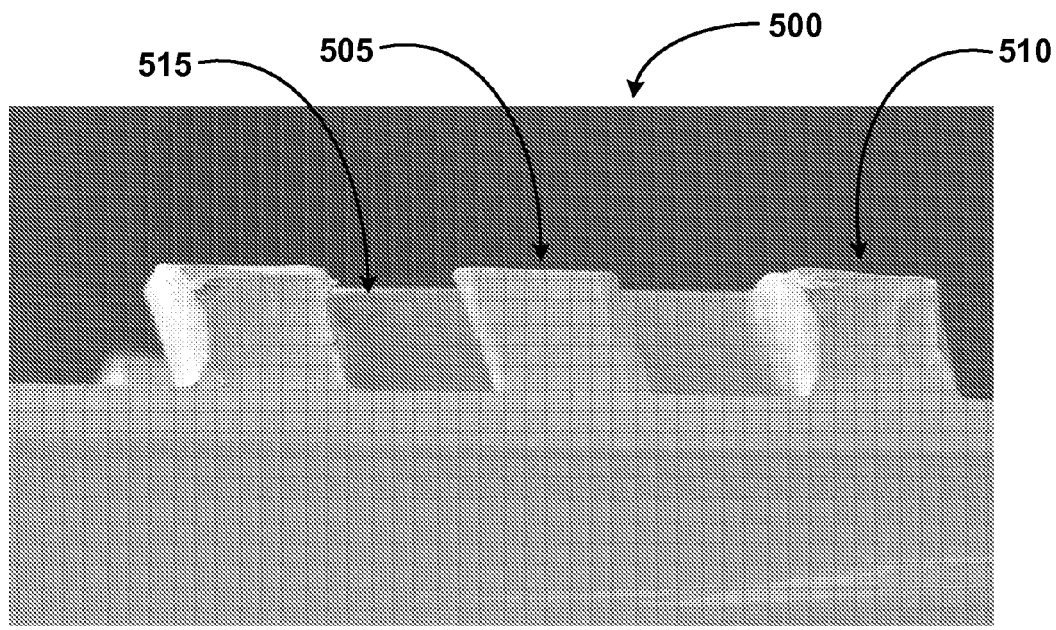
FIG. 6 illustrates a cross-sectional view of the sloped coaxial interconnect structure of FIG. 5 fabricated in accordance with some embodiments of the present invention.

FIG. 5 illustrates a side view of a sloped coaxial interconnect structure 500 fabricated in accordance with some embodiments of the present invention and FIG. 6 a cross-sectional view of the sloped coaxial interconnect structure 500. The interconnect structure 500 generally comprises an inner conductor 505, an outer conductor 510, and a gap 515 defined by and disposed between the conductors 505, 510. The gap can 515 clad the inner conductor 505 and when a gas, such as air, is disposed within the gap 515, an air cladding is disposed around the inner conductor 505. Other materials or a combination of materials can also be disclosed within the gap 515. As FIG. 5 depicts, multiple sloped interconnects can be formed in accordance with embodiments of the present invention to form an array of sloped interconnects.

As is best illustrated in FIG. 6, the inner conductor 505 and the outer conductor 510 have sloped sidewall surfaces. Indeed, the inner conductor 505 and the outer conductor 510 have an approximate slope angle of 22.5 degrees relative to the surface on which the interconnect structure 500 is disposed upon. Other sloped angles are possible in accordance with embodiments of the present invention. For example, the slope angle can range from approximately 0 to approximately 60 degrees. Also, it is possible to vary the slope angle of the inner conductor 405 and outer conductor 415 such that they have different slope angles. While FIGS. 5 & 6 illustrate a circular cross sectional shaped interconnect having sloped sidewalls, other geometrically shaped cross sections can be fabricated to have sloped sidewalls. For example, an interconnect having an octagonal cross section can be fabricated to have sloped sidewalls.

Figure 7:
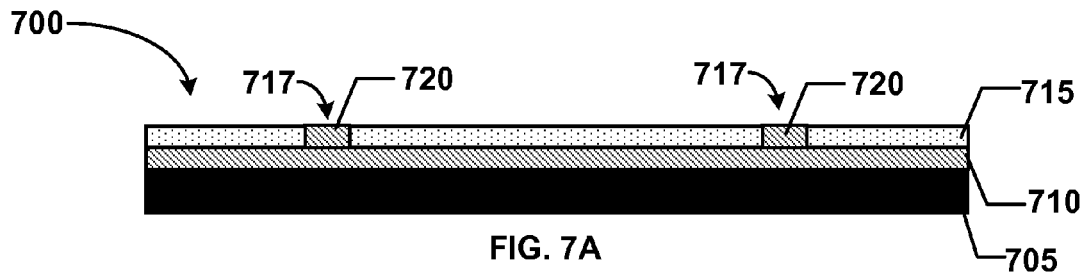
FIG. 7 illustrates an interconnect fabrication method according to some embodiments of the present invention with FIGS. 7A-7J showing various stages of such an interconnect fabrication method.
Figure 7:
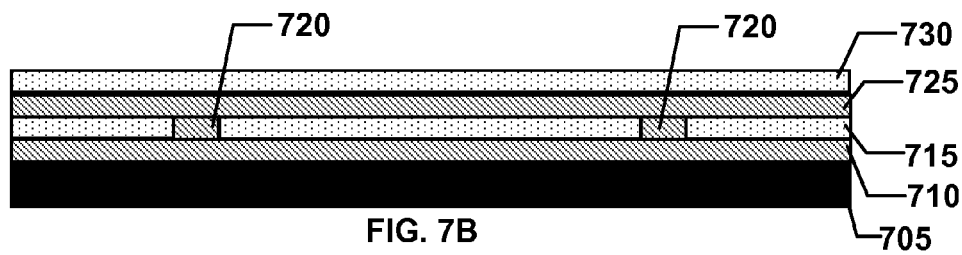
Figure 7:
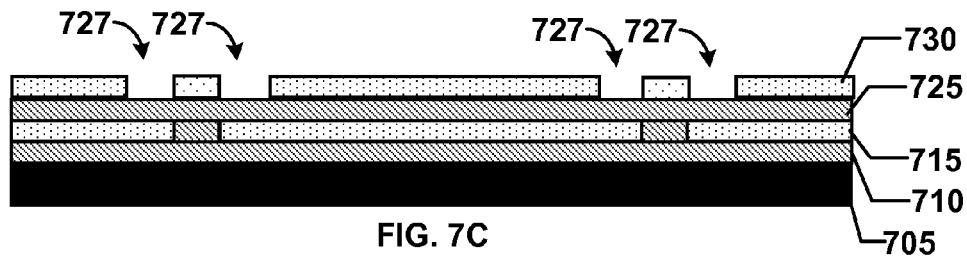
Figure 7:
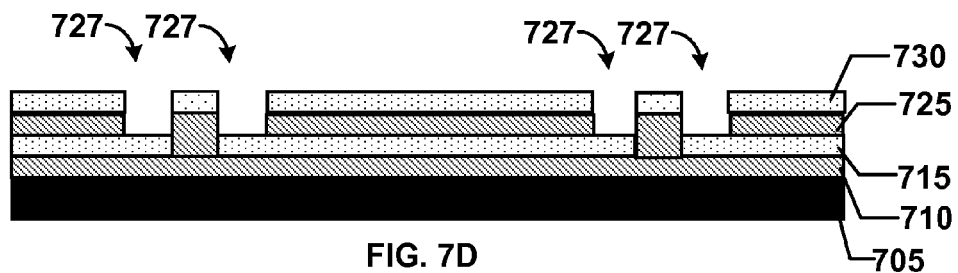
Figure 7:
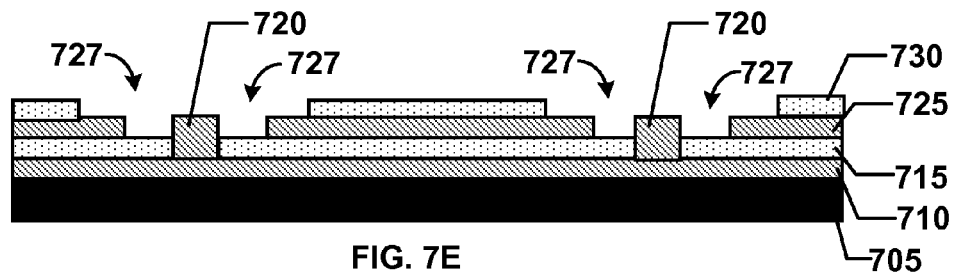
Figure 7:
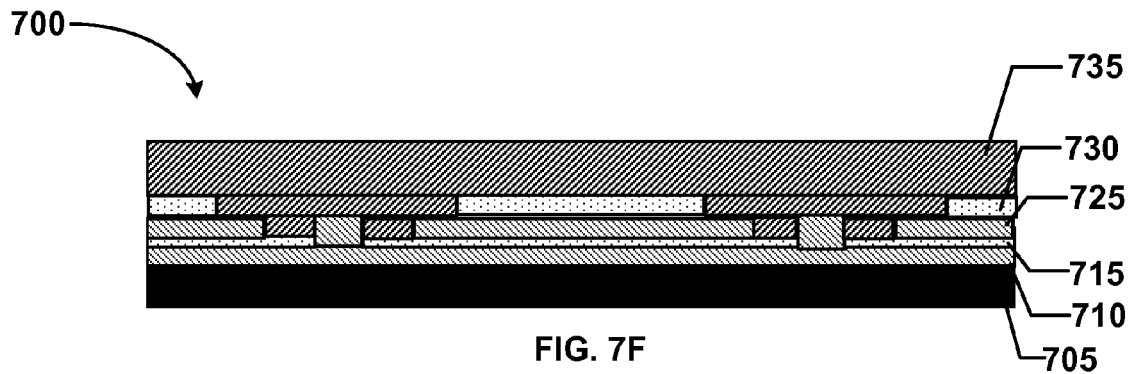
Figure 7:
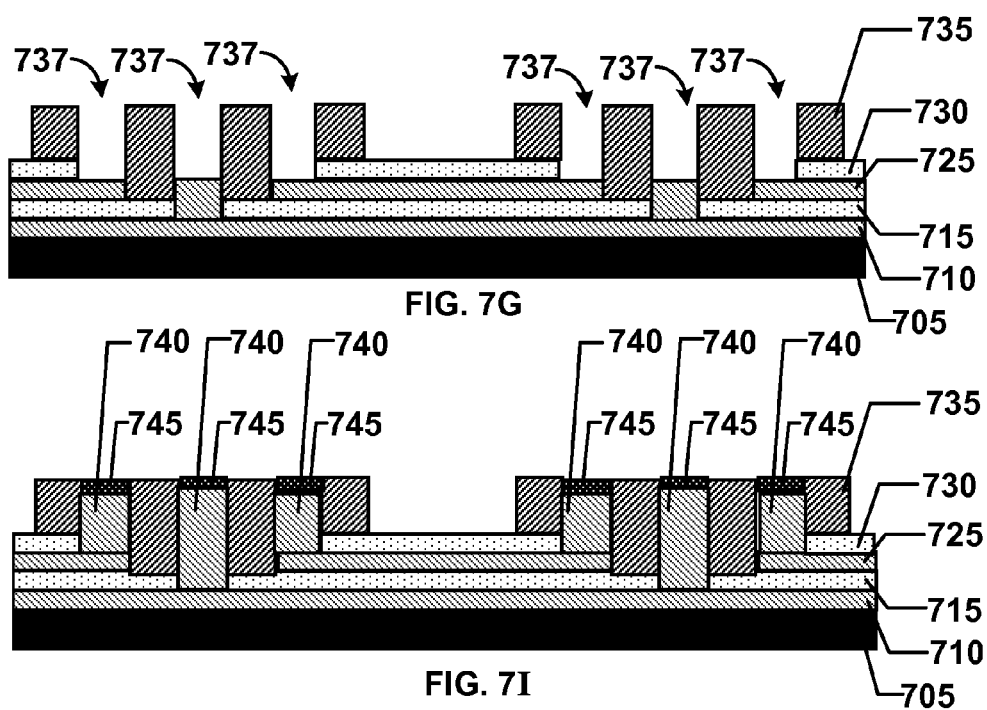
Figure 7:
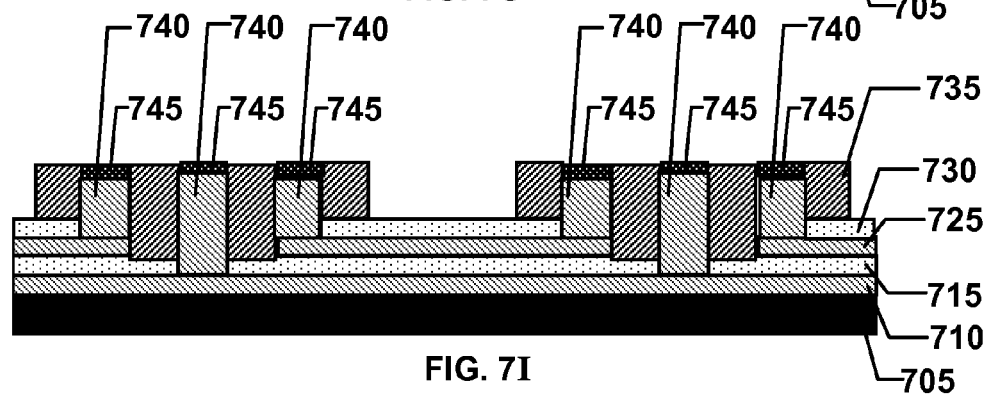
Figure 7:
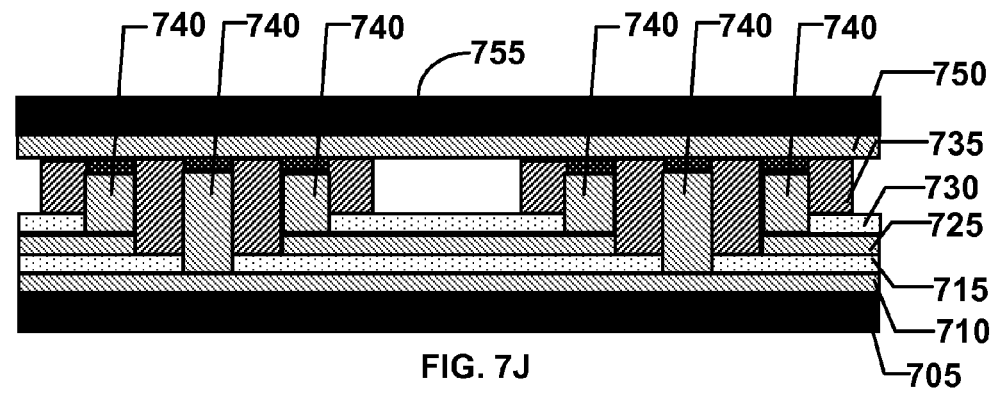

FIG. 7 illustrates an interconnect fabrication method 700 according to some embodiments of the present invention with FIGS. 7A-7I showing various stages of such an interconnect fabrication method. A method 700 can comprise creating high-performance interconnects by providing a first conductor, providing a second conductor, and disposing the second conductor around at least a portion of the first conductor to electrically isolate the conductors. A method can also comprise aligning the conductor in a substantially coaxial alignment such that formed interconnect is a coaxial interconnect. A method can also additionally comprise disposing the second conductor proximate at least a portion of the first conductor so that first conductor and the second conductor are electrically separated by a gap disposed between the first conductor and the second conductor and aligning the conductors in a substantially coaxial alignment.

It will be understood that process 700 is only one process implementation embodiment of the present invention and that other process embodiments are also possible. Also, process 700 can be performed in various orders and utilize additional process materials and parameters in fabricating interconnects.

The process 700 can begin by depositing several layers on a surface 705 as shown in FIG. 7A. The several layers can include a titanium/copper/titanium layer, which can be deposited to have a 30 nm, 1000 nm, and 10 nm thickness, respectively. Only the copper layer is shown as in FIG. 7A as metal layer 710 (or power plane 710). The copper layer can be first metallized by DC sputtering on a silicon wafer. The copper metal layer can form a power plane. As will be evidenced by process 700, the power plane 710 can be coupled to the inner conductors of the formed interconnects. Other metals can be used to form the power plane 710 such as gold, silver, nickel, or other conductive metals.

The process 700 can continue by depositing a layer of silicon dioxide 715 onto the metal layer 710. The silicon dioxide layer can be approximately 1.5 micrometers thick. The silicon dioxide layer 715 can be deposited on the metal layer 710 by plasma enhanced chemical vapor deposition (PECVD) at approximately 250° C. A photoresist, such as Microposit SC1813 photoresist (Shipley Corporation), can then be applied on the silicon dioxide 715. The photo resist can then be photo-patterned, and Buffered Oxide Etch (BOE) can be used to etch the silicon dioxide and titanium layers in the exposed, patterned areas. Any remaining photoresist can be removed with acetone.

This patterning and etching forms apertures 717. The apertures provide access to the metal layer 720 as shown in FIG. 7A. Next, a metal can be deposited in the apertures 717 to fill the apertures also as shown in 7A. For example, copper can be electroplated to fill the apertures 717 in the silicon dioxide layer.

The process then continues as shown in FIG. 7B. At this point in the process, a second metal layer 725 can be deposited. This metal layer 725 can form a ground plane. The ground plane can be used to couple the outer conductors of the resulting formed interconnects. An adhesive metal such as titanium may also be applied with the second metal layer 725 for adhesive purposes. For example, the metal layer 725 can be a layer of copper and the adhesive layer can be a layer of titanium. These metals can be sputtered to form the metal layer, the copper can have a thickness of approximately of 1000 nm, and the titanium can have a thickness of approximately 10 nm. Other metal types and thicknesses are also possible in accordance with additional embodiments of the present invention.

Then, a second silicon dioxide layer 730 can be deposited. The second silicon dioxide layer 730 can be photo-patterned to form additional apertures 727 as shown in FIG. 7C. These apertures 727 can form the base mold to assist in forming a shell conductor in the resulting coaxial interconnects. As shown in FIG. 7C, these apertures can be formed as circular rings around the electroplated copper pillars 720. Next as shown in FIG. 7D, the second metal layer 725 can be etched to isolate the first metal layer 710 (or power plane 710) from the second metal layer 725 (or ground plane 720). And, the silicon dioxide layer on top of the second metal layer 730 can be removed to expose formed copper pillars and annular rings as shown in FIG. 7E.

The process 700 then continues at FIG. 7F, when a polymer layer 735 can then be applied. The polymer layer 735 can be a thick layer of Avatrel 2195P (available from Promerus LLC in Brecksville, Ohio), and it can be spun on top of the patterned silicon dioxide layer 730. FIG. 7G shows the polymer layer 735 after being applied. The spin rate of the polymer can be approximately 500 rpm for approximately 60 seconds. Then the polymer can be softbaked for approximately 30 minutes softbake on a hotplate at 100° C. Then about an 250 mJ/cm2 UV exposure dose can be performed (365 nm irradiation). Following the exposure, a 20 min. post exposure bake at approximately 100° C. can be done followed by ultrasonic developing to produce hollow-core coaxial polymer plating molds 737 as shown in FIG. 7G.

Metal can then be deposited in the molds 737 to form metal pillars 740 as shown in FIG. 7H. For example, the metal pillars 740 can be formed by electroplate deposition of copper. The electroplating solution can comprise 0.5 M $H_2SO_4$, 0.5 M $CuSO_4$, 0.25 M brightener and 0.25 M carrier. Next, an adhesive 745, such as tin-lead solder (e.g., approximately 5 micrometer layer of Sn—Pb (60/40) solder), can be applied onto the metal pillars 740 as shown in FIG. 7H. Then the pillars 740 can be bonded with another copper surface 750 with an approximately 5 micrometer thick Sn—Pb (60/40) solder layer, which was electroplated on top of the copper coaxial structure as shown in FIG. 7J. The copper surface 750 can also be coupled to another component such as component 755.

Figure 8:
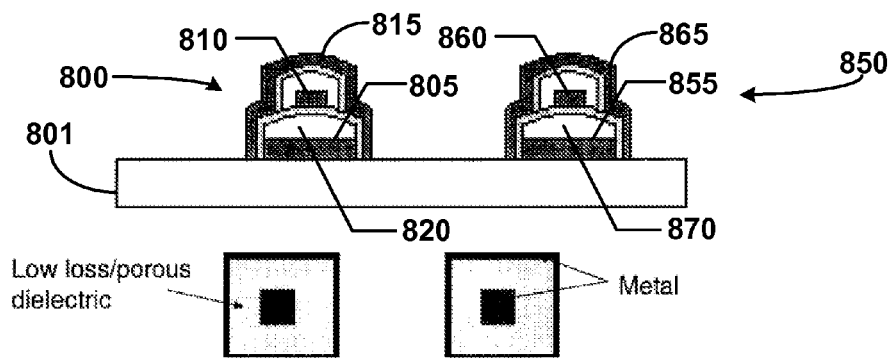
FIG. 8 illustrates a cross-sectional view of another interconnect structure according to the present invention which can be utilized as a transmission line.

FIG. 8 illustrates a cross-sectional view of two coaxial interconnect structures 800, 850 according to the present invention. The interconnect structures 800, 850 can be utilized as a transmission line to provide an electronic signal from one component to another component. The components may be located on the same substrate, on different substrates, or on different levels on a multilayered integrated package.

As shown, the interconnect structures 800, 850 generally comprises multiple conductors. These conductors can include bottom conductor 805, middle conductor 810, and outer conductor 815. Likewise, the interconnect structure 850 generally comprises multiple conductors. These conductors can include bottom conductor 855, middle conductor 860, and outer conductor 865. The multiple conductors of each interconnect 800, 850 can be formed in portions or have different segments. The segments may or may not physically contact each other.

The interconnect structures 800, 850 can be fabricated in a parallel plate arrangement and have a suspended ground microstrip configuration. Indeed as shown, the middle conductors 810, 860 are suspended above the bottom conductors 805, 855. The microstrips (or middle conductors 810, 860 can also be suspended above an organic substrate 801, such as FR4 or BT substrates. Also as shown, multiple interconnects 800 and 850 can be constructed on the same substrate 825 to transmit multiple signals. While the interconnects 800, 820 are illustrated on the same substrate level, they can be fabricated in a stacked alignment according to some embodiments of the present invention.

The interconnect structures 800, 850 also generally comprises gap regions 820, 870. The gap regions 820, 870 separates the conductors from each other. Air can be disposed within the gap region 820, 870 so that the interconnect structure can be a low-loss transmission line having air-cladding disposed around the middle conductors 810, 860. The gap region 820, 870 can include layered gaps. The layered gaps can be separated by a dividing material, such as a layer of polymer material. Advantageously, the gapped interconnect structure 800, 850 can provide a low effective dielectric constant and dissipation factor thereby resulting in lower attenuation and phase loss associated with the interconnect structure 800, 850. Thus, interconnects 800, 850 can be used for high frequency interchip communication with essentially zero dielectric loss and reduced conductor loss. Multilevel signaling techniques can be combined with the interconnects 800, 850 to achieve high data rates over long traces with low insertion loss. Shown below the interconnects 800, 850 in FIG. 8 are schematic representations of the coaxial alignment possible in accordance this embodiment of the present invention. As shown, an inner conductor (such as middle conductors 810, 860) are coaxially aligned with outer conductors (such as the bottom conductors 850, 855 and outer conductors 815, 865) of interconnects 800, 850.

Figure 9:
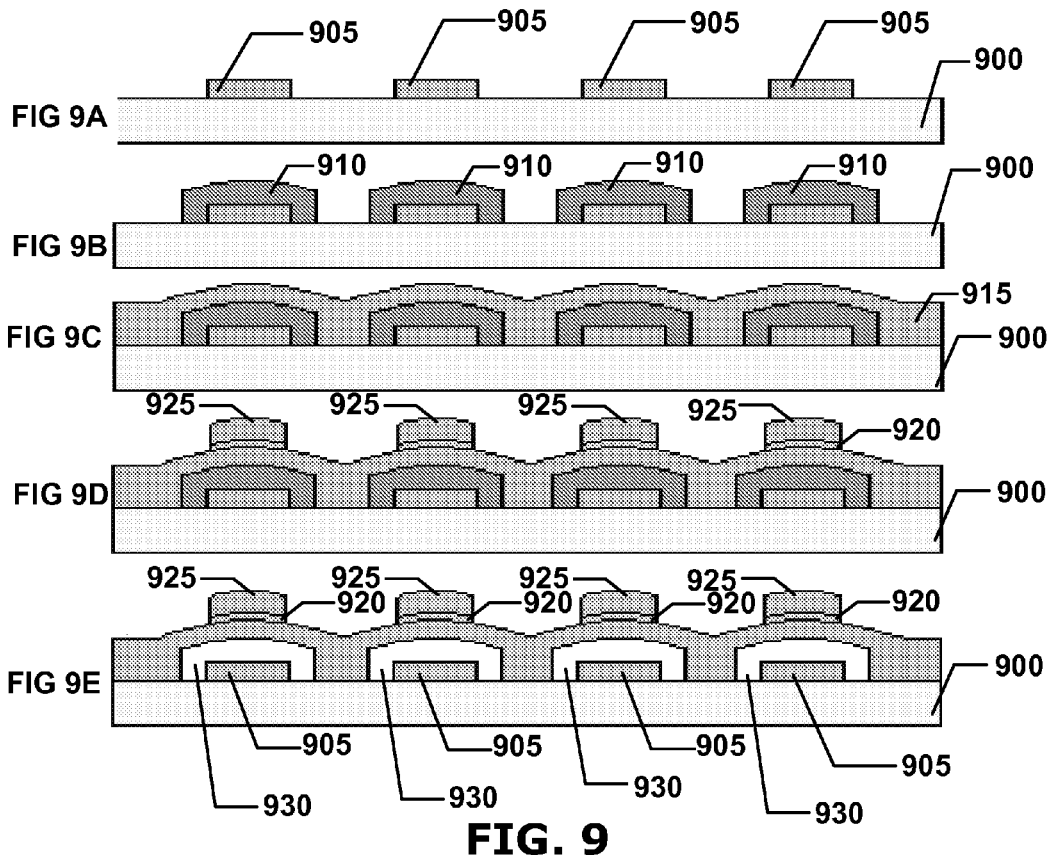
FIG. 9 illustrates an interconnect fabrication method according to some embodiments of the present invention with FIGS. 9A-9E showing various stages of such an interconnect fabrication method.

FIG. 9 illustrates an interconnect fabrication method according to some embodiments of the present invention with FIGS. 9A-9E showing various stages of such an interconnect fabrication method. Air-insulated parallel plate and suspended ground microstrip lines can created on organic substrates using CMOS-compatible processing techniques and sacrificial polymer. In general, a copper signal line can be etched with a sacrificial polymer layer defined around it and the polymer is then covered with an overcoat and an electroplated ground line.

The fabrication process 900 is in general a build up process. As shown in FIG. 9A, the process initiates by depositing a metal layer 905 on a substrate 900. The substrate can be an organic substrate such as FR4 or BT. The metal can be copper and be deposited to have a thickness of approximately 27 micrometers. After being deposited, the metal layer 905 can be patterned using and developed to form multiple metal segments 905 such as shown in FIG. 9A. The photoresist can be AZ4620 from Clariant and can be spun to a thickness of approximate 10 micrometers. The photoresist can be softbaked at approximately 110° C. for approximately 10 minutes. The photoresist can be photopatterned and the that metal layer can be etched and divided into segments have a width of approximately 220 micrometers. For example, the metal layer can be etched with a solution of approximately 15% $H_2O_2$ and approximately 5% $H_2SO_4$. The applied photoresist can then be stripped, leaving only the metal layer segments to form signal lines as shown in FIG. 9A.

A sacrificial polymer layer 910 can then be disposed onto the metal layer segments 905. The polymer can be a photosensitive sacrificial polymer, such as Unity 2203P from Promerus, LLC (Brecksville, Ohio). The polymer layer 910 can be spun onto the metal layer segments to have a thickness of approximately fifteen micrometers. The polymer layer 910 can then be soft-baked for approximately ten minutes then photodefined and developed on a hot plate. The hot plate can have a temperature of approximately 110° C. for approximately 10 minutes. Then the polymer layer 910 can then be rinsed with isopropyl alcohol, leaving portions of the polymer material 910 over the metal layer segments. The polymer material portions 910 can have approximately a 600 micrometer wide encapsulation regions over the metal layer segments 905 as shown in FIG. 9B.

Next, a dielectric material 915 can be provided on the polymer material 910 as illustrated in FIG. 9C. The dielectric material 915 can be Avatrel 2000P dielectric polymer, and it can be was spun onto at a thickness of approximately 20 micrometers over the encapsulated metal layer segments 905. The Avatrel can be dosed with approximately 200 mJ/cm$^2$ ($\lambda$=365 nm) and developed to define regions allowing access to the probe pads. An electroplating seed layer 920, such as titanium/copper/titanium can then be applied onto the dielectric material 915 to overcoat the dielectric material 915. The thickness of the seed layer can be approximately 150 angstroms for the titanium and approximately 1000 angstroms for the copper. The titanium layer can be used to increase adhesive characteristics of the copper.

After this, a second metal layer 925 can then be applied to form ground lines. The second metal layer 925 can be electroplated to a thickness of approximate 20 micrometers and the photoresist can be stripped. The second metal layer 920 can be a layer of copper and can form several segments of copper 920 as shown in FIG. 9D. The copper can be etched away with a solution of approximately 7.5% $H_2O_2$ and approximately 5% $H_2SO_4$. After etching the copper ground lines, FIG. 9D illustrates the fabrication process at this stage.

In a next stage, a polymer overcoat (not shown) can be applied onto the second metal layer 925. Then, the overcoat layer can then be defined as needed. For example, a photoresist can be applied to the overcoat layer. The photoresist can be AZ4620 and it can be spun to a thickness of approximately 10 micormeters. Then the photoresist can be exposed to define an electroplating mask for ground lines of three different widths. For example, the widths can be approximately 150 micrometers, 220 micrometers, and 650 micrometers.

Next, the titanium layer can be removed with a buffered oxide etch (BOE) solution. The polymer overcoat can be cured in a nitrogen purged tube furnace heated to approximately 180° C. for approximately 2 hours. The furnace temperature can have a ramp rate of approximately 3° C./min from 25° C. to 150° C. and approximately 1° C./min from 150° C. to 180° C. The polymer can be cured and also the sacrificial layer 910 can be decomposed. Holes or perforations can be made in the polymer overcoat to enable gases from the decomposition the encapsulated sacrificial layer 910 to permeate through the polymer overcoat. After fully decomposing, the sacrificial layer 910 is removed to form a gap 930 that separates the metal layer segments 905 and 925.

Figure 10:
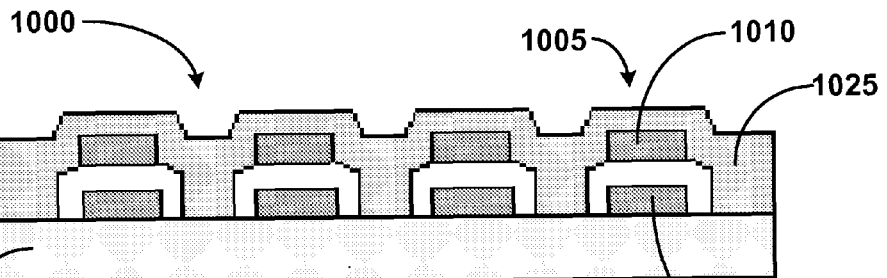
FIG. 10 illustrates a cross-sectional view of an interconnect array according to some embodiments of the present invention.
Figure 11:
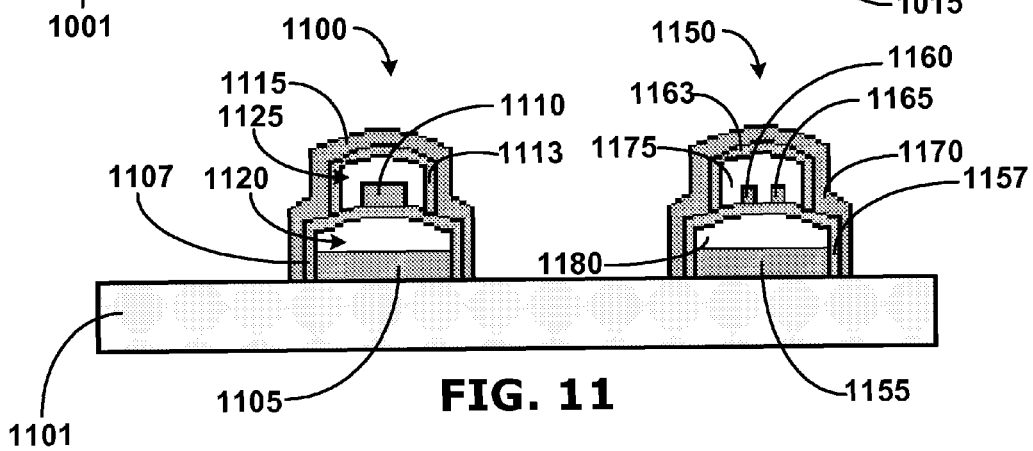
FIG. 11 illustrates a cross-sectional view of yet another interconnect structure according to some embodiments of the present invention.
Figure 12:
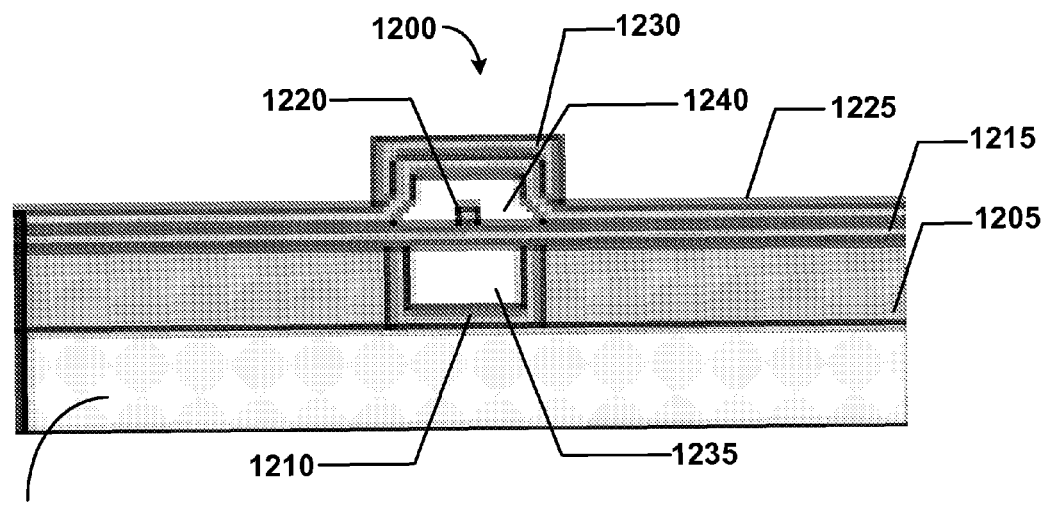
FIG. 12 illustrates a cross-sectional view of yet another interconnect structure according to some embodiments of the present invention.

FIGS. 10-12 illustrate other types of interconnect structures that can be fabricated in accordance with various embodiments of the present invention. FIG. 10 illustrates a cross-sectional view of an interconnect array 1000 having interconnect structures in which a first conductor is suspended above a second conductor. While the interconnect array 1000 is shown on the same substrate 1001, the interconnect array 1000 can consists of interconnect structures (or transmission lines) on various layers of a multilayer integrated package in other embodiments of the present invention.

The interconnect array 1000 can be used as an array of transmission lines to carry data signals. For example, consider interconnect 1005. As shown interconnect 1005 generally comprises a first conductor 1010 suspended above a second conductor 1015. Advantageously, the suspension of one conductor over another according to this and other embodiments of the present invention can enable a dielectric constant close to that of free space. The first conductor 1010 can be a ground strip and the second conductor 1015 can be a hot (or power) strip in accordance with some embodiments of the present invention.

As shown, the first conductor 1010 and the second conductor 1015 are separated by a gap region 1020. The gap region 1020 can be formed by decomposing a sacrificial material (not shown). Also, the gap region 1020 can be a void region such that it is filled with a gas, such as ambient air. Also, other materials can be disposed within the gap region 1020. For example, polymer and foam materials are examples of other materials. Still yet, a combination of a gas and a solid substance may disposed within the gap region 1020.

An overcoat layer 1025 is also shown in FIG. 10. The overcoat layer 1025 may be disposed on the first conductor 1010 as shown. As mentioned above, the overcoat layer 1025 can enable the suspension of the first conductor 1010 over the second conductor 1015. For example, after application of the overcoat layer 1025, holes or other perforations (not shown) may be made in the overcoat layer 1025. These holes or perforations can enable the escape of gaseous decomposition products that can originate during decomposition of a sacrificial polymer.

After decomposing a sacrificial layer to remove it, the first conductor 1010 can be at least partially disposed within the overcoat layer 1025 such that it is suspended above the second conductor 1015. Suspension of the first conductor 1010 can occur in many fashions. For example, a suspended conductor may be deposited on a polymer layer or can be disposed within a polymer layer. Alternatively, a metal overcoat layer may be deposited on a polymer layer such that the metal overcoat layer and the polymer layer encase another conductor.

FIG. 11 illustrates a cross-sectional view of additional interconnects 1100, 1150 according to some embodiments of the present invention. A shown the interconnects 1100, 1150 are disposed proximate a substrate 1101 and both generally comprise at least one conductor suspended above another conductor. More specifically, interconnect 1100 generally comprises a first conductor 1105, a second conductor 1110, and a third conductor 1115. As shown, the second conductor 1110 is suspended above the first conductor 1105, and the third conductor 1115 is suspended above the second conductor 1105. The first and third conductors 1105, 1115 may be disposed around the second conductor 1110. That is, the first and third conductors 1105, 1115 can form an outer shell around the second conductor 1110. In this arrangement the three conductors can be situated in a substantially coaxial alignment wherein the first and third conductors 1105, 1115 form an outer shell that is coaxial with the second conductor 1110.

The interconnect 1100 also generally comprises multiple suspension layers and air gaps. For example, the interconnect 1100 can include multiple suspension layers such as suspension layers 1107, 1113. The suspension layers 1107, 1113 can be a material capable of holding or suspending a conductor. For example, the suspension layers 1107, 1113 can be a polymer material. Suspension layer 1107 is shown as suspending the second conductor 1110 above the first conductor, and the suspension layer 1113 suspends the third conductor 1115 partially above the first and second conductors 1105, 1110.

The interconnect 1100 can also generally include a gap region. The gap region can comprise multiple gap spaces such as a first gap 1120 and a second gap 1125. The gaps 1120, 1125 can be formed by decomposing a sacrificial material. The gaps 1120, 125 can be positioned in a stacked or layered alignment. For example, as shown, the second gap 1125 is positioned above the first gap 1120. A dividing material, such as suspension layer 1107 can segment the gap region into the multiple gap spaces, such as the first gap 1120 and the second gap 1125.

According to the various embodiments of the present invention, various materials may be disposed within the first gap 1120 and the second gap 1125. For example, in some embodiments, a gas such as air may be disposed in both the first gap 1120 and the second gap 1125. In this exemplary embodiment, the air gaps provide an air cladding around the second conductor 1110. This air cladding separates the second conductor 1110 from the first and third conductor 1105, 1115. Alternatively, other materials such a solid or solid/gas combination may be disposed within the gaps 1120, 1125. For example, a polymer/air combination or a foam material (i.e., gas in solid matrix) may be disposed in the gaps 1120, 1125.

The other interconnect, interconnect 1150, illustrated in FIG. 11 has certain similar features relative to interconnect 1100. Indeed, interconnect 1150 generally comprises at least one conductor at least partially suspended above another conductor. For example, a second conductor 1160 and a third conductor 1165 are suspended above a first conductor 1155, and a fourth conductor 1170 is suspended partially above the first, second, and third conductors 1155, 1160, and 1165.

As shown, the second and third conductors 1160, and 1165 are two independent conductors according to other advantageous embodiments of the present invention. These dual conductors can enable transmission of multiple data signals by interconnect 1150 in a transmission line embodiment. In other embodiments, more than two signal carrying conductors can be utilized.

The interconnect 1150 may also comprise a gap region and suspension materials. The gap regions can be stacked or layered such as a first gap 1175 being stacked on a second gap 1180. The two gaps 1175, 1180 can encase or surround the second and third conductors 1160, 1165. This enables a substance or material that is disposed in the gaps 1175, 1180 to clad the second and third conductors 1160, 1165. For example, if air is disposed within the gaps 1175, 1180 then an air cladding can be disposed generally around the second and third conductors 1160, 1165.

FIG. 12 illustrates a cross-sectional view of yet another coaxial interconnect 1200 according to some embodiments of the present invention. This interconnect 1200 is generally comprised of multiple conductors and multiple insulation layers disposed on a substrate 1201. The conductors can be various metal conductive materials and the insulation layers can be various insulating materials, including a polymer material. Interconnect 1200 (as well as the certain other embodiments of the present invention) can be fabricated using nanoimprinting techniques in which a pattern is formed into resist and then additional materials are deposited and layered on the pattern. It should be understood that while interconnect 1200 is shown a single layer interconnect that in accordance with some embodiments of the present invention, the single layer interconnect 1200 can be layered on another interconnect to create a multiple layered interconnect. A multiple layered interconnect can be fabricated using based on imprint techniques such as nanoimprinting. For example, two halves of an interconnect could be fabricated and then bonded together to create a fully coaxial built up structure.

More particularly, and as shown, the interconnect 1200 comprises a first insulation layer 1205, a first conductor 1210, a second insulation layer 1215, a third conductor 1220, a third insulation layer 1225, and third conductor 1230. The first conductor 1210 can be disposed in a portion of the first insulation layer 1205, and the second isolation layer 1215 and the third isolation layer 1225 can be disposed between the first conductor 1210 and the third conductor 1230.

The second conductor 1220 can be positioned between the first conductor 1210 and the third conductor 1230. Indeed, as shown, the second conductor 1220 can be positioned on the second insulation layer 1215 such that it is suspended above the first conductor 1210 and the suspended below third conductor 1230. The first conductor 1210 and the third conductor 1230 can be electrically coupled together to form an outer shell having multiple detached portions or segments. The outer shell can be disposed around the second conductor 1220 in a substantially coaxial alignment such that the outer shell is situated substantially coaxially with the second conductor 1220. Such placement of the outer shell (first conductor 1210 and the third conductor 1230) enables the interconnect 1200 to be used as a transmission line that can carry an electronic signal from one component to another component.

The shell conductor formed by the detached portions (first conductor 1210 and the third conductor 1230) can also be formed with a continuous metal layer. In certain situations it may be desirable to form a continuous outer shell conductor. In addition, the outer shell conductor can also be perforated to enable the escape of gaseous decomposition products from a sacrificial polymer that is used to in forming a gap to separate two or more conductors.

The interconnect 1200 can also generally comprise multiple gap areas. For example, in this particular exemplary embodiment of the present invention, the second conductor 1220 can be disposed within a gap area. The gap area can comprise multiple gap regions, such as a first gap region 1235 and a second gap region 1240. The gap area can clad the second conductor 1220 such that any substance disposed within the first gap region 1235 and the second gap region 1240 can be disposed around the second conductor 1220. The gap area can also be divided by a divider that defines the first and second gap regions 1235, 1240. For example, and as illustrated in FIG. 12, the second insulator 1215 extends into the gap area and divides the gap area into the first gap region 1235 and the second gap region 1240. The gap regions 1235, 1240 can have the same internal volume in certain embodiments or have different internal volumes in other embodiments.

Figure 13:
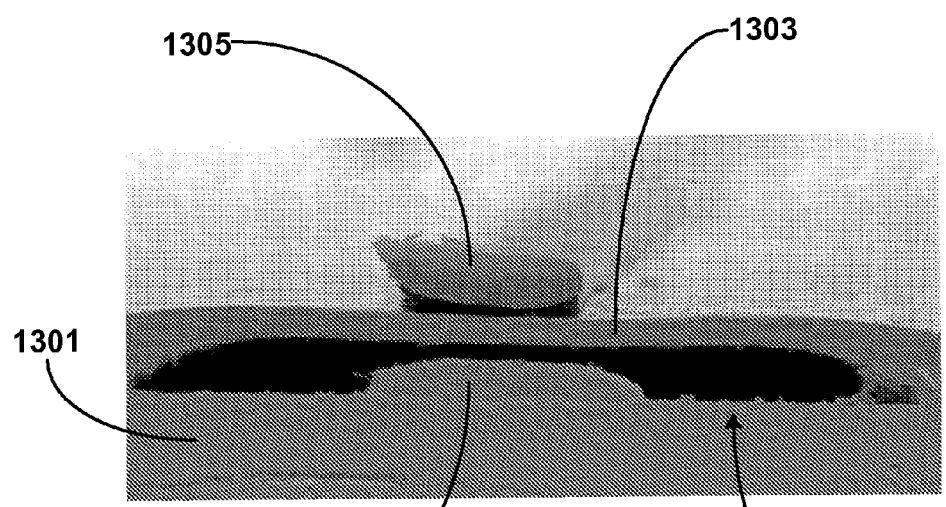
FIGS. 13-14 illustrate cross-sectional views of an interconnect structure fabricated in accordance with some embodiments of the present invention.
Figure 14:
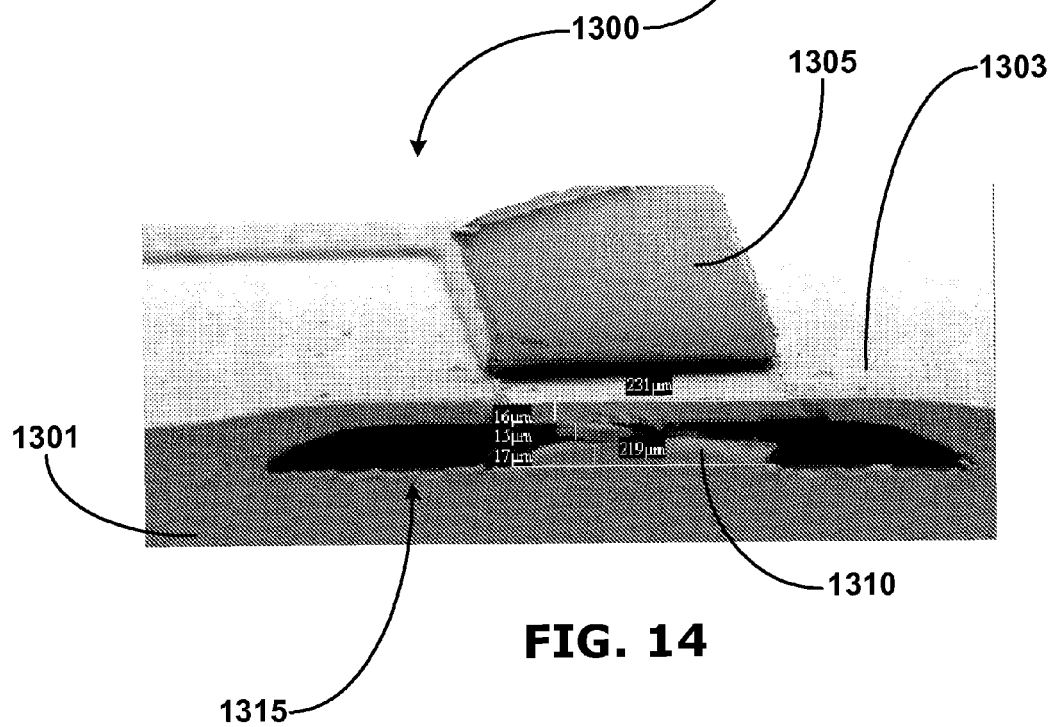

FIGS. 13-14 illustrate cross-sectional views of another interconnect structure 1300 fabricated in accordance with some embodiments of the present invention. As shown, a narrow ground microstrip line 1305 is shown suspended above a second conductor 1310 to form the parallel plate interconnect 1300. The parallel plate interconnect can be formed on a substrate, such as substrate 1301. As can be seen by comparing FIG. 1 and FIGS. 13-14, this parallel plate interconnect structure 1300 is similar to the interconnect depicted in FIG. 1. In FIG. 14, the inventors peeled back or removed a portion of the ground microstrip line 1305 to further study the interconnect structure 1300.

The parallel plate interconnect 1300 can also comprise additional components. Indeed, the ground microstrip line 1305 is disposed on a layer of polymer material 1303 such that the polymer material 1303 acts a suspension layer to suspend the ground microstrip line 1305 above the second conductor 1310. Also as shown, the ground microstrip line 1305 and the second conductor 1310 define a gap 1315 between them.

The interconnect structure 1300 shown in FIGS. 13-14 is a sample interconnect embodiment that the inventors fabricated. In this particular interconnect 1300, the inventors fabricated its components to have certain physical dimensions. For example, the ground microstrip line 1305 has a width of approximately 231 micrometers and the second conductor 1310 has a width of approximately 219 micrometers. Also, the thickness of the suspension polymer layer 1303 is approximately 16 micrometers, the gap 1315 has a height of approximately 15 micrometers between the polymer layer 1303 and the second conductor 1310, and the second conductor 1310 has a thickness of approximately 17 micrometers. These physical dimensions are exemplary and others are possible in accordance with the various embodiments of the present invention.

Figure 15:
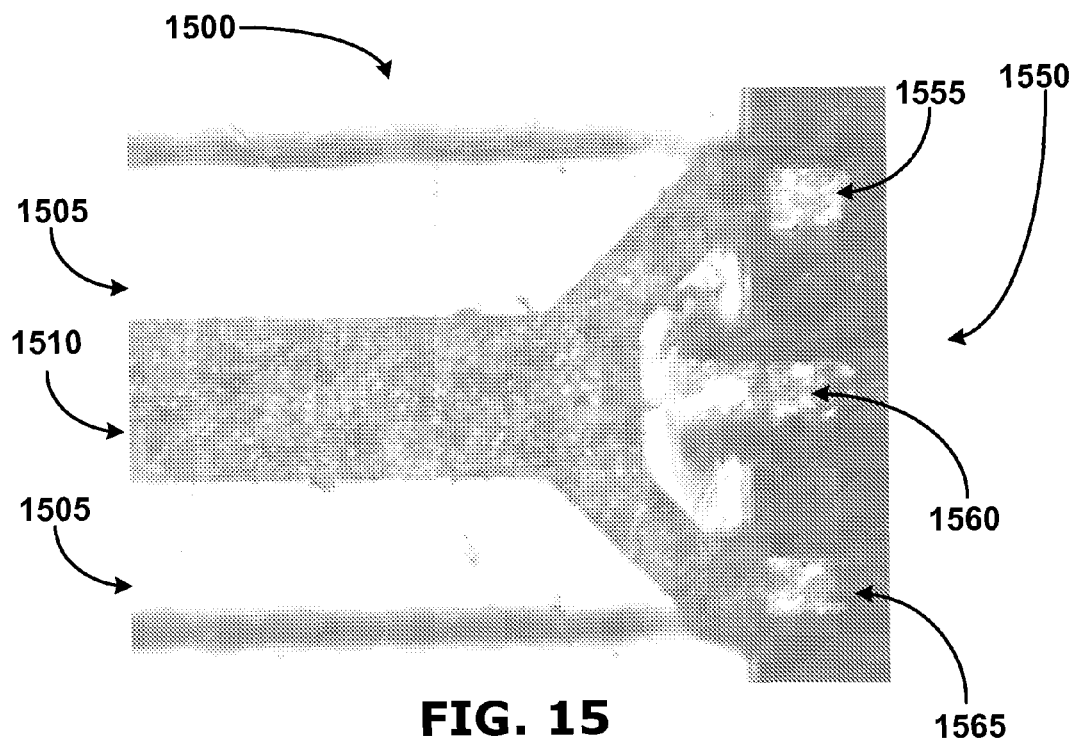
FIG. 15 illustrates a top view of a parallel plate interconnect structure and associated probe pads connecting the parallel plate interconnect structure to another component.

FIG. 15 illustrates a top view of an interconnect structure 1500 and associated probe pad array 1505. The interconnect 1500 can be a parallel plate interconnect similar to that shown in FIGS. 13-14 and can comprise a first conductor 1505 and a second conductor 1510. The first conductor 1505 can be suspended above the second conductor 1510 such that the conductors 1505, 1510 are separated from each other. For example, the conductors 1505, 1510 may define a gap between each other and the gap may consist essentially of air so that the first conductor 1505 is cladded by air.

The probe pad array 1505 can comprise multiple probes. For example, the multiple probes can include a first probe 1555, a second probe 1560, and a third probe 1565. The probe pad array 1505 (and the multiple probes 1555, 1560, 1565) enables the interconnect 1500 to be connected to another component. As shown, the multiple probes 1555, 1560, 1565 are arranged in a fan out arrangement. The first and third probes 1555, 1565 may be used to couple another component to the second conductor 1510 and the second probe 1560 may be used to couple the first conductor to another component. It should be understood that other types of probe pad arrays can be utilized in accordance with the embodiments of the present invention.

Figure 16:
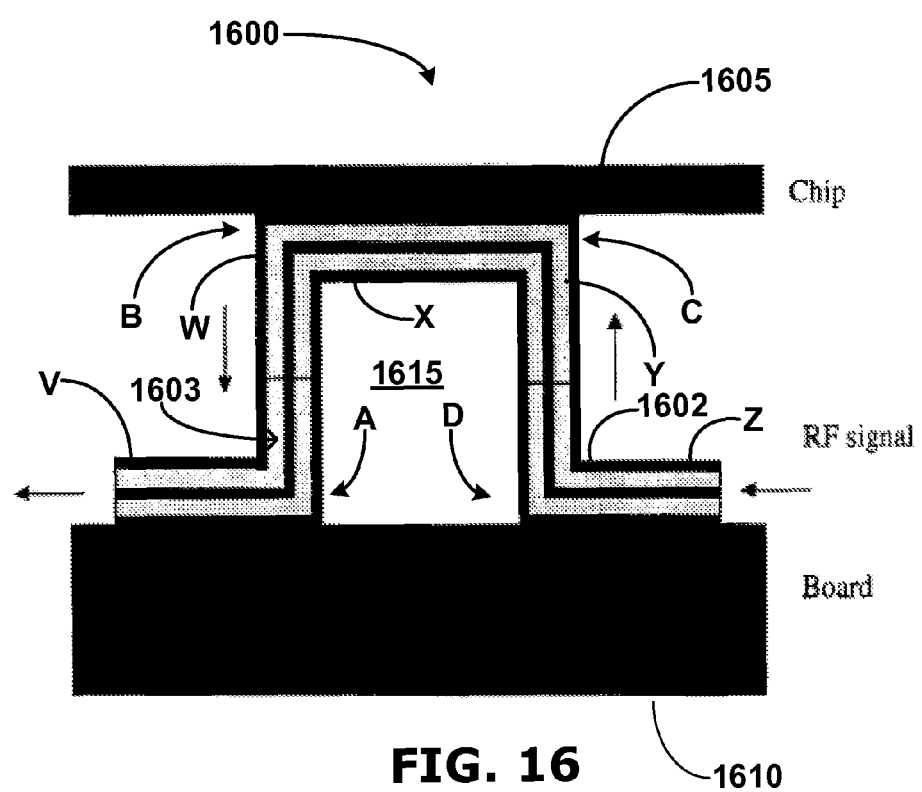
FIG. 16 illustrates a perspective view of an interconnect structure fabricated in accordance with some embodiments of the invention that can be used to route radio frequency signals.

FIG. 16 illustrates a perspective view of an interconnect 1600 fabricated in accordance with some embodiments of the invention that can be used to route radio frequency signals. As illustrated, the interconnect 1600 has an outer shell conductor 1602 and an inner conductor 1603. The outer shell conductor 1602 and the inner conductor 1603 can be aligned in substantially coaxial alignment according to some embodiments of the present invention. Also the outer shell conductor 1602 and the inner conductor 1603 can define an air cladding that is disposed between the outer shell conductor 1602 and the inner conductor 1603.

Generally shown in FIG. 16 is a chip 1605 connected proximate a circuit board (or substrate) 1610. The chip 1605 and the board 1610 define a gap 1615 situated between the chip 1605 and the board 1610. The interconnect 1600 can be positioned within the gap 1615 to connect the chip 1605 and the board 1615.

This interconnect embodiment 1600 can be fabricated to have multiple vertical and multiple horizontal segments. For example, and as shown, the interconnect 1600 has a first horizontal segment V, a second horizontal segment X, and a third horizontal segment Z. The interconnect 1600 can also have a first vertical segment W and a second vertical segment Y. The horizontal and vertical segments enable the interconnect 1600 to route an electrical signal via the outer shell conductor 1602 and the inner conductor 1603, such as an RF signal, between components, such as the chip 1605 and the board.

The segments V-Z of the interconnect 1600 can be joined together to have corresponding angular turns A-D. At these angular turns the sidewall surfaces of the outer shell conductor 1602 and the inner conductor 1603 can have corresponding angular turns as depicted in FIG. 16. While shown as approximately 90 degree turns in FIG. 16, other angular turns are also achievable in accordance with other embodiments of the present invention.

The embodiments of the present invention are not limited to the particular formulations, process steps, and materials disclosed herein as such formulations, process steps, and materials may vary somewhat. Moreover, the terminology employed herein is used for the purpose of describing exemplary embodiments only and the terminology is not intended to be limiting since the scope of the various embodiments of the present invention will be limited only by the appended claims and equivalents thereof. For example, temperature and pressure parameters may vary depending on the particular materials used.

Therefore, while embodiments of this invention have been described in detail with particular reference to exemplary embodiments, those skilled in the art will understand that variations and modifications can be effected within the scope of the invention as defined in the appended claims. Accordingly, the scope of the various embodiments of the present invention should not be limited to the above discussed embodiments, and should only be defined by the following claims and all equivalents.

We claim:

1. An integrated circuit interconnect structure, the structure comprising:
    a first conductor of an interconnect;
    a second conductor of an interconnect;
    a first layer of suspension material that defines a first gap in a region disposed below the first layer of suspension material; and
    a second layer of suspension material stacked on the first layer of suspension material, the second layer of suspension material defining a second gap stacked above the first gap, and
    wherein the second gap is enclosed by the second layer of suspension material and the first layer of suspension material; and
    wherein the first conductor and the second conductor are contained within at least one of the first gap and the second gap and are spaced apart from each other in the first gap or the second gap.

2. The integrated circuit interconnect structure of claim 1, further comprising an outer conductor disposed at least partially around the first and second layers of suspension material.

3. The integrated circuit interconnect structure of claim 1, wherein the first conductor and the second conductor are independent conductors configured to carry multiple data signals.

4. The integrated circuit interconnect structure of claim 1, wherein the first gap and the second gap comprise air.

5. The integrated circuit interconnect structure of claim 1, further comprising a third conductor generally placed around the first and second layers of suspension material and a fourth conductor disposed below the first layer of suspension material such that the third and fourth conductors form an outer shell.

6. An integrated circuit interconnect structure, the structure comprising:
    a first layer of suspension material placed on a substrate, the first layer of suspension material defining a first gap between an underside of the first layer of suspension material and the substrate;
    a second layer of suspension material stacked on the first layer of suspension material, the second layer of suspension material defining a second gap disposed between an underside of the second layer of suspension material and a topside of the first layer of suspension material; and
    wherein the second gap is enclosed by the second layer of suspension material and the first layer of suspension material; and
    a pair of independent, spaced apart conductors disposed on at least one of the top side of the first layer of suspension material in the second gap such the spaced apart conductors are co-located in the second gap or in the first gap below the first layer of suspension material such that the spaced apart conductors are co-located in the first nap.

7. The integrated circuit interconnect structure of claim 6, further comprising an outer conductor disposed on exterior edges of the first and second layers of suspension material such that the outer conductor is located outside of the first and second gaps.

8. The integrated circuit interconnect structure of claim 6, wherein the first and second gaps comprise air.

9. The integrated circuit interconnect structure of claim 6 further comprising an outer shell that is situated in coaxial arrangement with the pair of independent, spaced apart conductors, the outer shell comprising a first outer conductor disposed on the external edges of the first and second layers of suspension material and a second outer conductor disposed below the first gap, the second outer conductor being spaced apart from the first outer conductor by the first layer of suspension material.

10. The integrated circuit interconnect structure of claim 6, wherein the second gap encases the pair of independent, spaced apart conductors when said conductors are disposed on the top side of the first layer of suspension material.

11. An integrated circuit interconnect structure, the structure comprising:
    a first conductor of an interconnect spaced apart from a second conductor of an interconnect, the first conductor and the second conductor having different electrical potential such that the conductors are independent conductors; and
    a layer of suspension material arranged to segment a gap region of the interconnect into an upper gap region and a lower gap region, wherein the upper gap region is disposed to be stacked on the lower gap region, and
    wherein the upper gap region defines a first enclosed volume that is enclosed off from the lower gap region by the layer of suspension material and the lower gap region defines a second enclosed volume that is enclosed off from the upper gap region by the layer of suspension material,
    and wherein the first conductor and the second conductor are co-located and disposed in at least one of the upper gap region and the lower gap region.

12. The integrated circuit interconnect structure of claim 11, wherein the lower gap region and the upper gap region comprise air, and the air in the being disposed between the first conductor and the second conductor.

13. The integrated circuit interconnect structure of claim 11, further comprising a second layer of suspension material stacked on the layer of suspension material, the second layer of suspension material defining the upper gap region.

14. The integrated circuit interconnect structure of claim 11, wherein the first conductor and the second conductor are configured to carry multiple data signals.

15. The integrated circuit interconnect structure of claim 11, further comprising an outer shell that surrounds and encases the upper and lower gap regions.

* * * * *